United States Patent
Yang et al.

(10) Patent No.: US 7,291,882 B2
(45) Date of Patent: Nov. 6, 2007

(54) PROGRAMMABLE AND ERASABLE DIGITAL SWITCH DEVICE AND FABRICATION METHOD AND OPERATING METHOD THEREOF

(75) Inventors: Ching-Sung Yang, Hsinchu (TW); Wei-Zhe Wong, Tainan (TW)

(73) Assignee: Powerchip Semiconductor Corp., Hsinchu (TW)

( * ) Notice: Subject to any disclaimer, the term of this patent is extended or adjusted under 35 U.S.C. 154(b) by 259 days.

(21) Appl. No.: 11/162,893

(22) Filed: Sep. 27, 2005

(65) Prior Publication Data

US 2006/0231888 A1 Oct. 19, 2006

(30) Foreign Application Priority Data

Apr. 19, 2005 (TW) .............................. 94112347 A

(51) Int. Cl.
*H01L 21/8247* (2006.01)

(52) U.S. Cl. .............. 257/321; 257/401; 257/E29.304; 257/E27.103; 257/E21.681; 438/213; 438/279; 438/287; 438/288; 438/264; 365/185.07; 365/185.28

(58) Field of Classification Search ................ 438/213, 438/279, 287, 288, 264, FOR. 220; 257/321, 257/401, E29.304, E27.103, E21.681; 365/185.07, 365/185.28
See application file for complete search history.

(56) References Cited

U.S. PATENT DOCUMENTS

| 5,538,908 | A * | 7/1996 | Kim ........................... 438/204 |
| 6,200,862 | B1 * | 3/2001 | Gardner et al. ............. 438/279 |
| 6,448,596 | B1 * | 9/2002 | Kawajiri et al. ............ 257/292 |
| 6,548,355 | B2 * | 4/2003 | Pio ............................ 438/264 |
| 6,916,711 | B2 * | 7/2005 | Yoo ........................... 438/259 |
| 7,166,887 | B2 * | 1/2007 | Park et al. .................. 257/315 |
| 2001/0001294 | A1 * | 5/2001 | Pio ............................ 438/258 |
| 2004/0033664 | A1 * | 2/2004 | Park .......................... 438/264 |
| 2004/0188754 | A1 * | 9/2004 | Yoo ........................... 257/321 |

* cited by examiner

Primary Examiner—George Fourson
(74) Attorney, Agent, or Firm—Jianq Chyun IP Office

(57) ABSTRACT

A programmable and erasable digital switch device is provided. An N-type memory transistor and a P-type memory transistor are formed over a substrate. The N-type memory transistor includes a first N-type doped region, a second N-type doped region, a first charge storage layer and a first control gate. The P-type memory transistor includes a first P-type doped region, a second P-type doped region, a second charge storage layer and a second control gate. A common bit line doped region is formed between the N-type memory transistor and the P type memory transistor and electrically connects the first N-type region to the second P-type doped region. A word line electrically connects the first control gate to the second control gate.

37 Claims, 9 Drawing Sheets

PROGRAMMABLE AND ERASABLE DIGITAL SWITCH DEVICE AND FABRICATION METHOD AND OPERATING METHOD THEREOF

CROSS-REFERENCE TO RELATED APPLICATION

This application claims the priority benefit of Taiwan application serial no. 94112347, filed on Apr. 19, 2005. All disclosure of the Taiwan application is incorporated herein by reference.

BACKGROUND OF THE INVENTION

1. Field of the Invention

The present invention relates to a semiconductor device, a fabrication method and an operating method thereof, and more particularly, to a programmable and erasable digital switch device, a fabrication method and an operating method thereof.

2. Description of the Related Art

An integrated circuit usually includes programmable devices. These programmable devices control the connection of devices in the circuit. These programmable devices are fuses or antifuses.

Fuses are adapted to connect main memory cell arrays and redundancy memory cell arrays. If partial memory blocks in the main memory cell arrays fail and cannot be repaired, fuses are burned out by an electric current or a laser to change the connection among the remaining normal memory cell arrays. The redundancy memory cell arrays then replace the failed memory cell arrays to provide the normal operation of the memory.

Antifuses connect transistors of gate arrays of a logic circuit. It means that each transistor of a gate array is coupled to an antifuse. While the gate arrays are programmed, a high voltage is applied to the antifuses so that dielectric layers of the antifuses are broken through. At this moment, the antifuses are in the "on" state. If no voltage is applied, the antifuses are in the "off" state. Accordingly, the programming of the antifuses is determined by whether the voltage is applied to the antifuses so as to make the antifuses "on" or "off". Therefore, the gate arrays are programmed.

However, either fuses or antifuses can only be programmed once. It means that the programming is not reversible. Their applications thus are limited. In addition, electric current or laser burning out fuses or breakdown of dielectric layers of antifuses is required for the programming operation. These operations may damage other devices.

SUMMARY OF THE INVENTION

Accordingly, the present invention is directed to a programmable and erasable digital switch device, a fabrication method and an operating method thereof. By multiple erasing or programming the programmable and erasable digital switch device, digital information is defined therein. The programmable and erasable digital switch device is adapted to multiple programming and erasing operations.

The present invention is also directed to a programmable and erasable digital switch device, a fabrication and an operating method thereof. The erasing and programming of the programmable and erasable digital switch device are performed by the FN tunneling effect. Accordingly, the programmable and erasable digital switch device can be operated under low power.

The present invention is directed to a programmable and erasable digital switch device, a fabrication method and an operating method thereof. The method of fabricating the programmable and erasable digital switch device is simple and compatible with the traditional method of fabricating a memory.

The present invention provides a programmable and erasable digital switch device. The digital switch device includes a substrate, an N-type memory transistor, a P-type memory transistor, a common bit line and a word line. The N-type memory transistor is disposed over the substrate. The N-type memory transistor includes a first N-type doped region, a second N-type doped region, a first charge storage layer and a first control gate. The P-type memory transistor is disposed next to the N-type memory transistor. The P-type memory transistor includes a first P-type doped region, a second P-type doped region, a second charge storage layer and a second control gate, wherein the second control gate is electrically coupled to the first control gate. The common bit line doped region is electrically coupled to the N-type memory transistor and the P-type memory transistor.

In the aforementioned programmable and erasable digital switch device, the digital switch device further includes a common bit line. The common bit line is electrically coupled to the common bit line doped region.

In the aforementioned programmable and erasable digital switch device, the digital switch device further includes a word line. The word line electrically connects the first control gate and the second control gate.

In the aforementioned programmable and erasable digital switch device, the first charge storage layer is electrically coupled to the second charge storage layer. The material of the first charge storage layer and the second charge storage layer can be doped polysilicon.

In the aforementioned programmable and erasable digital switch device, the common bit line doped region is constituted of the first N-type doped region surrounding by the second P-type doped region. The second P-type doped region further disposed under first charge storage layer and adjacent to the second N-type doped region.

In the aforementioned programmable and erasable digital switch device, the digital switch device further includes a common bit line electrically coupled to the common bit line doped region, and electrically short to the second P-type doped region and the first N-type doped region.

In the aforementioned programmable and erasable digital switch device, the N-type memory transistor further includes: a first inter-gate dielectric layer, disposed between the first charge storage layer and the first control gate; and a first tunnelling dielectric layer, disposed between the first charge storage layer and the substrate. The P-type memory transistor further includes: a second inter-gate dielectric layer, disposed between the second charge storage layer and the second control gate; and a second tunnelling dielectric layer, disposed between the second charge storage layer and the substrate.

The present invention provides a programmable and erasable digital switch device. The digital switch device includes a substrate, a first conductive type well, a first stacked gate structure, a second stacked gate structure, a first conductive type first doped region, a first conductive type second doped region, a second conductive type first doped region and a second conductive type second doped region. The first conductive type well is disposed within the substrate. The first stacked gate structure and the second stacked gate structure are disposed over the substrate. The first stacked gate structure includes a first charge storage layer and a first control gate. The second stacked gate structure includes a second charge storage layer and a second control gate. The first control gate is electrically coupled to the second control gate. Each of the first conductive type first doped region and the first conductive type second doped region is disposed within the substrate adjacent to one of the two sides of the first stacked gate structure. Each of the second conductive type first doped region and a second conductive type second doped region is disposed within the substrate adjacent to one of the two sides of the second stacked gate structure. Wherein, the second conductive type first doped region surrounds the first conductive type second doped region and extends under the first stacked gate structure.

In the aforementioned programmable and erasable digital switch device, the first charge storage layer and the second charge storage layer are formed as an integral layer. The material of the first charge storage layer and the second charge storage layer can be silicon nitride or doped polysilicon.

In the aforementioned programmable and erasable digital switch device, the digital switch device further includes a conductive plug. The conductive plug is electrically short to and connects the second conductive type first doped region and the first conductive type second doped region.

In the aforementioned programmable and erasable digital switch device, the first stacked gate structure further includes a first inter-gate dielectric layer, disposed between the first charge storage layer and the first control gate; and the second stacked gate structure further includes a second inter-gate dielectric layer, disposed between the second charge storage layer and the second control gate.

In the aforementioned programmable and erasable digital switch device, the first stacked gate structure further includes a first tunnelling dielectric layer, disposed between the first charge storage layer and the substrate; and the second gate stack structure further includes a second tunnelling dielectric layer, disposed between the second charge storage layer and the substrate.

In the aforementioned programmable and erasable digital switch device, the first conductive type is N-type, and the second conductive type is P-type.

In the aforementioned programmable and erasable digital switch device, the second conductive type third doped region is adjacent to the first conductive type second doped region.

In the aforementioned programmable and erasable digital switch device, the P-type doped region extends to the substrate under the stacked gate structure and is adjacent to the N-type doped region. It means that the P-type doped region serves as the well region of the N-type memory transistor. Accordingly, the substrate of the N-type memory transistor does not require an additional P-type well region. The manufacturing process is saved. Moreover, the P-type doped region surrounds the N-type doped region, constituting the common bit line doped region. The N-type memory transistor and the P-type memory transistor share the common bit line doped region. The integrity of the device thus is enhanced.

Additionally, the charge storage layer of the N-type memory transistor is electrically coupled to the charge storage layer of the P-type memory transistor. When the N-type memory transistor and the P-type memory transistor are in the programmed or erased state, the electrical features of the N-type memory transistor and the P-type memory transistor are more consistent.

The present invention provides a method of fabricating a programmable and erasable digital switch device. According to the method, a substrate is provided first. At least one first stacked gate structure and at least one second stacked gate structure are formed over the substrate. The first stacked gate structure includes a first tunnelling dielectric layer, a first charge storage layer, a first inter-gate dielectric layer and a first control gate. The second stacked gate structure includes a second tunnelling dielectric layer, a second charge storage layer, a second inter-gate dielectric layer and a second control gate. The first control gate is electrically coupled to the second control gate. A first conductive type first doped region is formed within the substrate between the first stacked gate structure and the second stacked gate structure. The first conductive type first doped region extends under the first stacked gate structure. A second conductive type first doped region and a second conductive type second doped region are formed within the substrate adjacent to two sides of the first stacked gate structure, wherein the first conductive type first doped region surrounds the second conductive type second doped region. A first conductive type second doped region is formed within the substrate outside the second stacked gate structure.

In the aforementioned method of fabricating the programmable and erasable digital switch, the method further includes forming a conductive plug over the substrate. The conductive plug is electrically connecting the second conductive type first doped region and the first conductive type first doped region.

In the aforementioned method of fabricating the programmable and erasable digital switch, the first charge storage layer and the second charge storage layer are formed as an integral layer.

In the aforementioned method of fabricating the programmable and erasable digital switch device, the method of forming the first conductive type first doped region within the substrate between the first stacked gate structure and the second stacked gate structure includes the following steps. A first patterned mask layer is formed over the substrate, and the first patterned mask layer exposes the substrate between the first stacked gate structure and the second stacked gate structure. Then, an ion implantation process with a tilt angle is performed to form the first conductive type first doped region so that the first conductive type first doped region extends under the first stacked gate structure. The first patterned mask layer is then removed.

In the aforementioned method of fabricating the programmable and erasable digital switch device, the method of forming the second conductive type first doped region and the second conductive type second doped region includes the following steps. First, a second patterned mask layer is formed over the substrate, and the second patterned mask layer exposes the substrate on the two sides of the first stacked gate structure. An ion implantation process is then performed to form the second conductive type first doped region and the second conductive type second doped region. Then, the second patterned mask layer is removed.

In the aforementioned method of fabricating the programmable and erasable digital switch device, the method of forming the first conductive type second doped region includes the following steps. First, a third patterned mask layer is formed over the substrate, and the third patterned mask layer exposes the substrate beside the second stacked gate structure corresponding to the first conductive type first region. An ion implantation process then is performed to form the first conductive type fourth doped region. Then, the third patterned mask layer is removed.

In the aforementioned method of fabricating the programmable and erasable digital switch device, the method of forming at least one first stacked gate structure and at least one second stacked gate structure over the substrate includes the following steps. First, a first dielectric layer is formed over the substrate. Then, a strip conductive layer is formed over the first dielectric layer. A second dielectric layer is formed over the substrate. A conductive layer is then formed over the second dielectric layer. The conductive layer, the second dielectric layer, the strip conductive layer and the first dielectric layer are patterned to form the first stacked gate structure and the second stacked gate structure. Wherein, the strip conductive layer is patterned to form the first charge storage layer and the second charge storage layer. The material of the first charge storage layer and the second charge storage layer can be doped polysilicon separately.

In the aforementioned method of fabricating the programmable and erasable digital switch device, the method of forming at least one first stacked gate structure and at least one second stacked gate structure over the substrate includes the following steps. First, a first dielectric layer is formed over the substrate. A charge storage material layer is then formed over the first dielectric layer. Then, a second dielectric layer is formed over the substrate. Next, a conductive layer is formed over the second dielectric layer. Finally, the conductive layer, the second dielectric layer, the charge storage material layer and the first dielectric layer are patterned to form the first stacked gate structure and the second stacked gate structure. Wherein, the patterned charge storage material layer forms the first charge storage layer and the second charge storage layer. The first charge storage layer and the second charge storage layer are formed as an integral layer. The material of the first charge storage layer and the second charge storage layer can be doped polysilicon or silicon nitride.

In the aforementioned method of fabricating the programmable and erasable digital switch device, the P-type doped region can be precisely formed in the desired area by the ion implantation method with a tilt angle. The N-type memory transistor and the P-type memory transistor share the common bit line doped region. The P-type doped region serves not only as a source/drain region of the P-type memory transistor, but also as the substrate well region of the N-type memory transistor. Not only is the manufacturing process saved, but the integrity of the device is enhanced.

The present invention provides a method of operating a programmable and erasable digital switch device. The method is adapted for the programmable and erasable digital switch device. The programmable and erasable digital switch device includes an first conductive type memory transistor at least including a first conductive type first doped region, a first conductive type second doped region, a first charge storage layer and a first control gate; a second conductive type memory transistor at least including a second conductive type first doped region, a second conductive type second doped region, a second charge storage layer and a second control gate; a common bit line electrically coupled to a common bit line doped region constituted by the first conductive first type doped region and the second conductive type second doped region; and a word line electrically connecting the first control gate and the second control gate According to the method, while the programmable and erasable digital switch device is erased, electrons are injected into the first charge storage layer and the second charge storage layer so that the first conductive type memory transistor and the second conductive type memory transistor have positive threshold voltages.

In the aforementioned method of operating the programmable and erasable digital switch device, the steps of erasing the programmable and erasable digital switch device include: applying a first voltage to the word line; applying a second voltage to the second conductive type first doped region and the first conductive type second doped region; and floating the common bit line so that electrons are injected into the first charge storage layer and the second charge storage layer by F-N tunneling effect to erase the first conductive type memory transistor and the second conductive type memory transistor. Wherein, the first voltage is about 10V, and the second voltage is about −8V.

In the aforementioned method of operating the programmable and erasable digital switch device, while the erased programmable and erasable digital switch device is read, the method further includes applying a third voltage to the word line; applying 0V to the second conductive type first doped region; and applying a fourth voltage to the first conductive type second doped region so that the first conductive type memory transistor remains off and the second conductive type memory transistor outputs 0V through the common bit line. Wherein, the third voltage is about 0V, and the fourth voltage is about Vcc.

In the aforementioned method of operating the programmable and erasable digital switch device, while the erased programmable and erasable digital switch device is programmed, electrons are ejected from the first charge storage layer and the second charge storage layer so that the first conductive type memory transistor and the second conductive type memory transistor have negative threshold voltages.

In the aforementioned method of operating the programmable and erasable digital switch device, the steps of programming the programmable and erasable digital switch device include: applying a fifth voltage to the word line; floating the second conductive type first doped region and the first conductive type second doped region; and applying a sixth voltage to the common bit line so that electrons are ejected from the first charge storage layer and the second charge storage layer by F-N tunneling effect to program the first conductive type memory transistor and the second conductive type memory transistor. Wherein, the fifth voltage is about −9V, and the sixth voltage is about 6V.

In the aforementioned method of operating the programmable and erasable digital switch device, while the programmed programmable and erasable digital switch device is read, the method further includes: applying a seventh voltage to the word line; applying 0V to the second conductive type first doped region; and applying an eighth voltage to the first conductive type second doped region so that the second conductive type memory transistor maintains off and the first conductive type memory transistor outputs 0V through the common bit line. Wherein, the seventh voltage is about 0V, and the eighth voltage is about Vcc.

In the aforementioned method of operating the programmable and erasable digital switch device, when the programmable and erasable digital switch device is erased, the voltage (0V) same as the voltage of the second conductive type doped region can be obtained at the bit line (output terminal). When the programmable and erasable digital switch device is programmed, the voltage (Vcc) same as the voltage of the first conductive type doped region can be obtained at the bit line (output terminal). By erasing or programming the programmable and erasable digital switch device, digital data, such as "0" or "1", can be obtained at the bit line (output terminal).

If the materials of the charge storage layer of the first conductive type memory transistor and the charge storage layer of the second conductive type memory transistor are conductive materials, such as doped polysilicon, and these charge storage layers are electrically coupled, the erased and programmed states of the first conductive type memory transistor and the second conductive type memory transistor can be more consistent. Accordingly, the stability and reliability of the programmable and erasable digital switch device of the present invention can be improved.

Additionally, the erasing and programming of the programmable and erasable digital switch device of the present invention are performed with FN tunneling effect. It has high electron injection efficiency and low current consumption. The power consumption of the whole chip is efficiently reduced. Moreover, the present invention can erase and program of the programmable and erasable digital switch device for multiple times. Accordingly, the output of the programmable and erasable digital switch device of the present invention can be modified when needed.

The above and other features of the present invention will be better understood from the following detailed description of the preferred embodiments of the invention that is provided in communication with the accompanying drawings.

DESCRIPTION OF SOME EMBODIMENTS

Figure 1A:
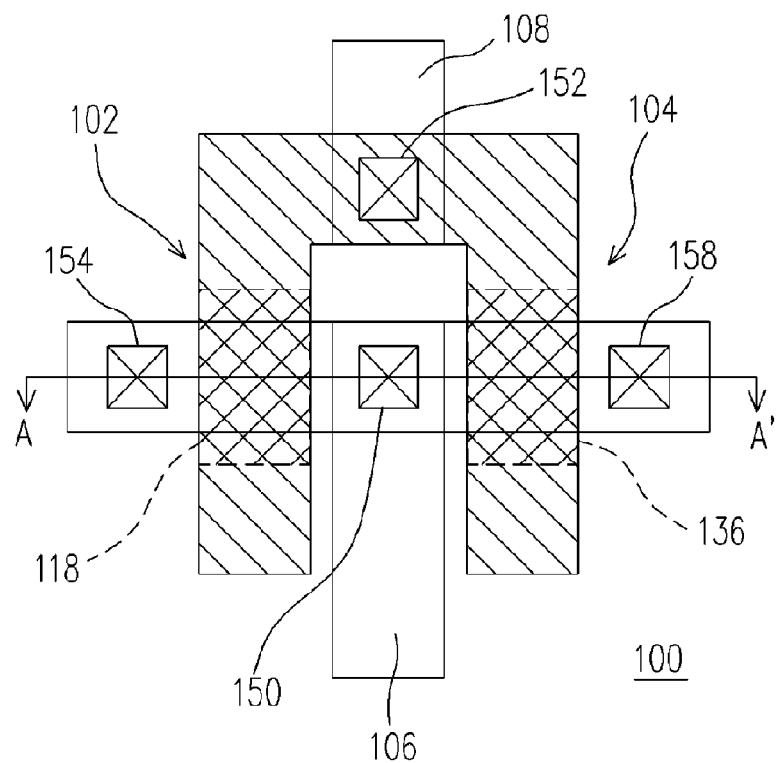
FIG. 1A is a top view of a programmable and erasable digital switch device according to a preferred embodiment of the present invention.
Figure 1B:
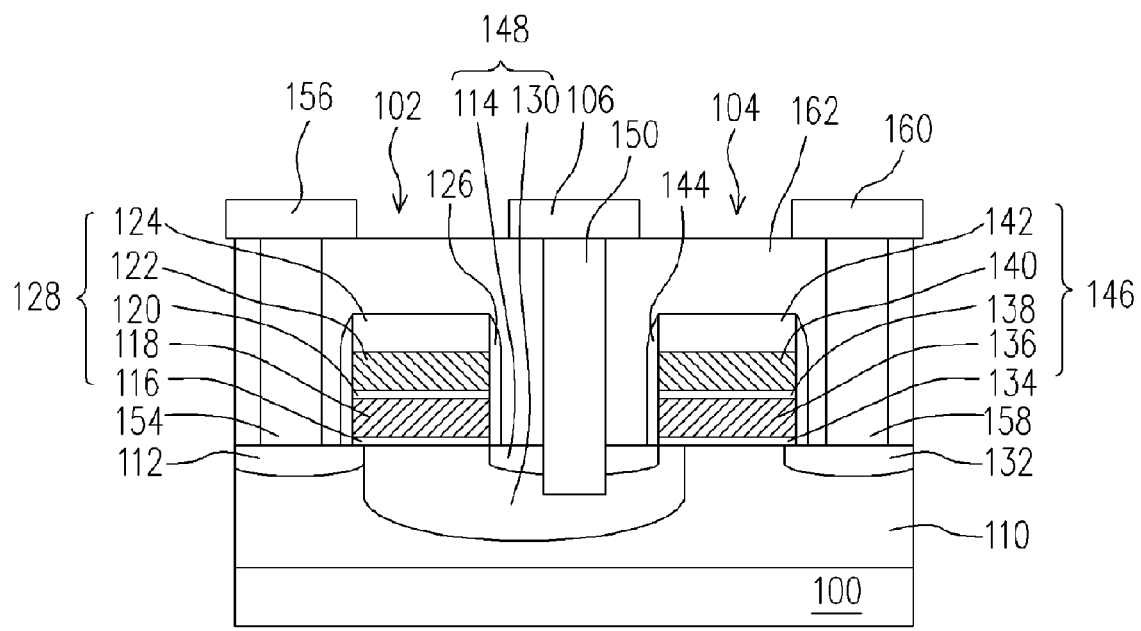
FIG. 1B is a cross sectional view of the structure of FIG. 1A along A-A'.
Figure 1C:
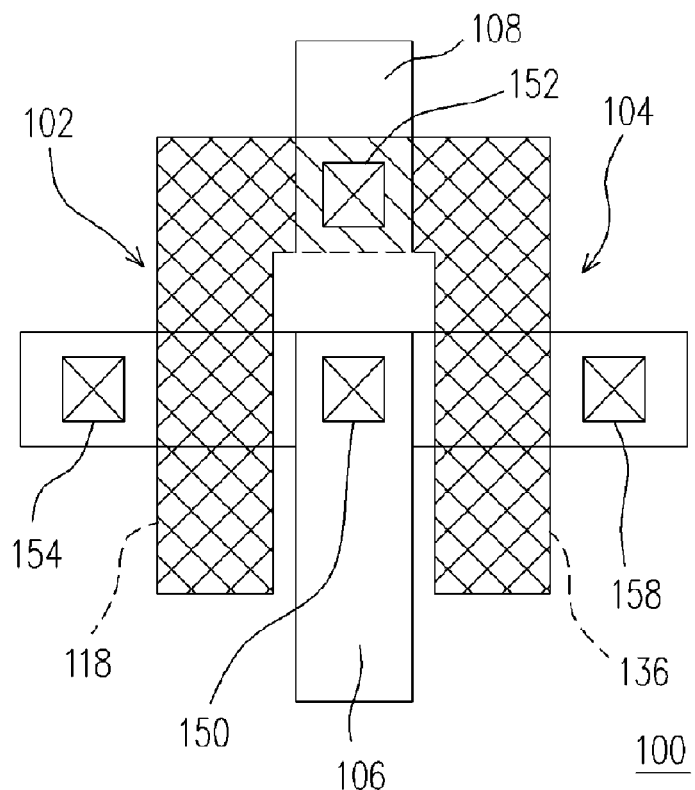
FIG. 1C is a top view of a programmable and erasable digital switch device according to another preferred embodiment of the present invention.

FIG. 1A is a top view of a programmable and erasable digital switch device according to a preferred embodiment of the present invention. FIG. 1B is a cross sectional view of the structure of FIG. 1A along A-A'. FIG. 1C is a top view of a programmable and erasable digital switch device according to another preferred embodiment of the present invention.

Referring to FIGS. 1A and 1B, the programmable and erasable digital switch device of the present invention includes, for example, the substrate 100, the N-type memory transistor 102, the P-type memory transistor 104, the common bit line 106 and the word line 108.

The substrate 100 can be, for example, a silicon substrate. In the embodiment, the N-type well region 110 is formed within the substrate 100, for example.

The N-type memory transistor 102 is disposed over the substrate 100, for example. The N-type memory transistor 102 includes, for example, the N-type doped region 112, the N-type doped region 114, the tunnelling dielectric layer 116, the charge storage layer 118, the inter-gate dielectric layer 120, the control gate 122, the cap layer 124 and the spacers 126.

The tunnelling dielectric layer 116, the charge storage layer 118, the inter-gate dielectric layer 120, the control gate 122, the cap layer 124 and the spacers 126 are sequentially formed over the substrate 100 to constitute the stacked gate structure 128. The N-type doped regions 112 and 114 are disposed within the substrate 100 adjacent to two sides of the stacked gate structure 128, for example. The spacers 126 are disposed on the sidewalls of the stacked gate structure 128, for example.

The P-type memory transistor 104 is disposed over the substrate 100, for example. The P-type memory transistor 104 includes, for example, the P-type doped region 130, the P-type doped region 132, the tunnelling dielectric layer 134, the charge storage layer 136, the inter-gate dielectric layer 138, the control gate 140, the cap layer 142 and the spacers 144.

The tunnelling dielectric layer 134, the charge storage layer 136, the inter-gate dielectric layer 138, the control gate 140, the cap layer 142 and the spacers 144 are sequentially formed over the substrate 100 to constitute the stacked gate structure 146. The P-type doped regions 130 and 132 are disposed within the substrate 100 adjacent to two sides of the stacked gate structure 146, for example. The P-type doped region 130 further extends to the substrate 100 under the stacked gate structure 128, and is adjacent to the N-type doped region 112, for example. The P-type doped region 130, for example, surrounds the N-type doped region 114. The P-type doped region 130 and the N-type doped region 114 constitute the common bit line doped region 148. The spacers 144 are disposed on the sidewalls of the stacked gate structure 146, for example.

The material of the tunnelling dielectric layers 116 and 134 can be, for example, silicon oxide. The material of the charge storage layers 118 and 136 can be, for example, a material adapted to store charges, such as semiconductor materials (doped polysilicon) or charge trapping materials (silicon nitride). The material of the control gates 120 and 138 can be, for example, a conductive material, such as doped polysilicon. The material of the inter-gate dielectric layers 122 and 140 can be, for example, an insulation material which can be a single layer, e.g. a silicon oxide layer, or a multiple layer, e.g. a silicon oxide/silicon nitride (ON) layer, or a silicon oxide/silicon nitride/silicon oxide (ONO) layer. The material of the cap layers 124 and 142 can be, for example, an insulation material, such as silicon oxide or silicon nitride. The material of the spacers 126 and 144 can be, for example, an insulation material, such as silicon oxide or silicon nitride. Referring to FIG. 1A, the control gate 122 is electrically coupled to the control gate 140. The charge storage layers 118 and 136 are separated. Referring to FIG. 1C, the charge storage layers 118 and 136 can be connected to each other, for example, can be formed as an integral layer.

The common bit line 106 is disposed, for example, between the N-type memory transistor 102 and the P-type memory transistor 104, and electrically coupled to the common bit line doped region 148, which is constituted by the N-type doped region 114 and the P-type doped region 130. The common bit line 106 is electrically coupled to the common bit line doped region 148 through the conductive plug 150, for example. The conductive plug 150 is electrically short to and connects the N-type doped region 114 and the P-type doped region 130, for example.

The word line 108 electrically connects and controls the control gates 122 and 140 via the conductive plug 152, for example. The conductive plug 154 and the conductive line 156 are disposed over the N-type doped region 112, for example. The conductive plug 158 and the conductive line 160 are disposed over the P-type doped region 132, for example. In addition, the conductive plugs 150, 152, 154 and 158 are disposed in the inter dielectric layer 162, for example. The common bit line 106, the word line 108 and the conductive lines 156 and 160 are disposed over the inter dielectric layer 162, for example. The material of the inter dielectric layer 162 includes insulation materials, for example, silicon oxide.

In this embodiment of the present invention, the P-type doped region 130 extends toward the substrate 100 under the stacked gate structure 128, and is adjacent to the N-type doped region 112. It means that the P-type doped region 130 also serves as a well region of the N-type memory transistor 102. Accordingly, the substrate 100 of the N-type memory transistor 102 does not require additional P-type well. The manufacturing process thus is reduced. Additionally, the P-type doped region 130 surrounds the N-type doped region 114 to constitute the common bit line doped region 148. The N-type memory transistor 102 and the P-type memory transistor 104 share the common bit line doped region 148. Thus, the device integrity is enhanced.

Moreover, as shown in FIG. 1C, the charge storage layer 118 of the N-type memory transistor 102 is electrically coupled to the charge storage layer 136 of the P-type memory transistor 104. When the N-type memory transistor 102 and the P-type memory transistor 104 are in the programmed or erased state, the electrical features of the N-type memory transistor 102 and the P-type memory transistor 104 will be more consistent.

Figure 2:
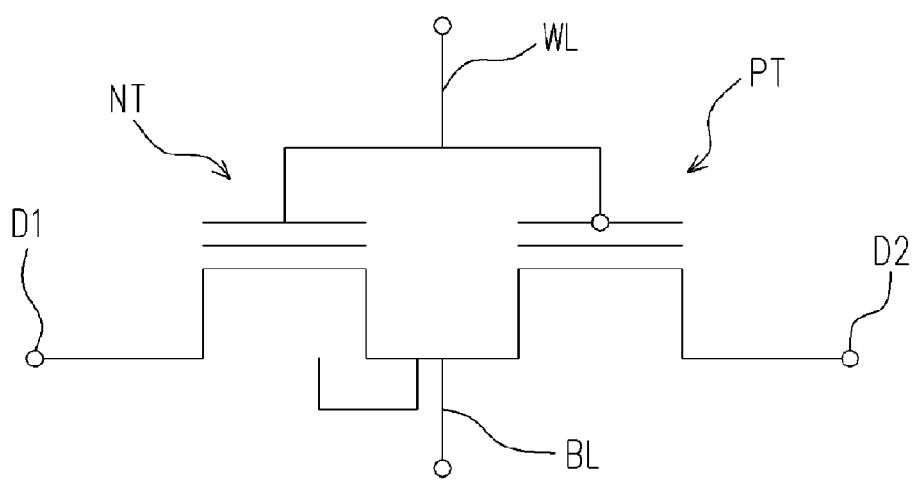
FIG. 2 is a schematic circuit showing a programmable and erasable digital switch device according to an embodiment of the present invention.

FIG. 2 is a schematic circuit showing a programmable and erasable digital switch device according to an embodiment of the present invention.

Referring to FIG. 2, the programmable and erasable digital switch device of the present invention includes the N-type memory transistor NT, the P-type memory transistor PT, the word line WL (input terminal) and the bit line BL (output terminal).

The N-type memory transistor NT is coupled to the P-type memory transistor PT, for example. An N-type doped region of the N-type memory transistor NT and a P-type doped region of the P-type memory transistor PT are coupled to the bit lint BL (output terminal). The word line WL (input terminal) is coupled to the control gate of the N-type memory transistor NT and the control gate of the P-type memory transistor PT. Different voltages are applied to another N-type doped region D1 of the N-type memory transistor NT and another P-type doped region D2 of the P-type memory transistor PT.

According to the programmable and erasable digital switch device of the present invention, the erased or programmed state of the N-type memory transistor NT and the P-type memory transistor PT determines whether the output voltage from the bit line BL (output terminal) should be applied to the N-type doped region D1 or to the P-type doped region D2.

FIGS. 3A-3D are schematic drawings showing a method of operating a programmable and erasable digital switch device according to a preferred embodiment of the present invention. FIGS. 4A and 4B are schematic circuits showing a method of operating a programmable and erasable digital switch device according to a preferred embodiment of the present invention.

Figure 3A:
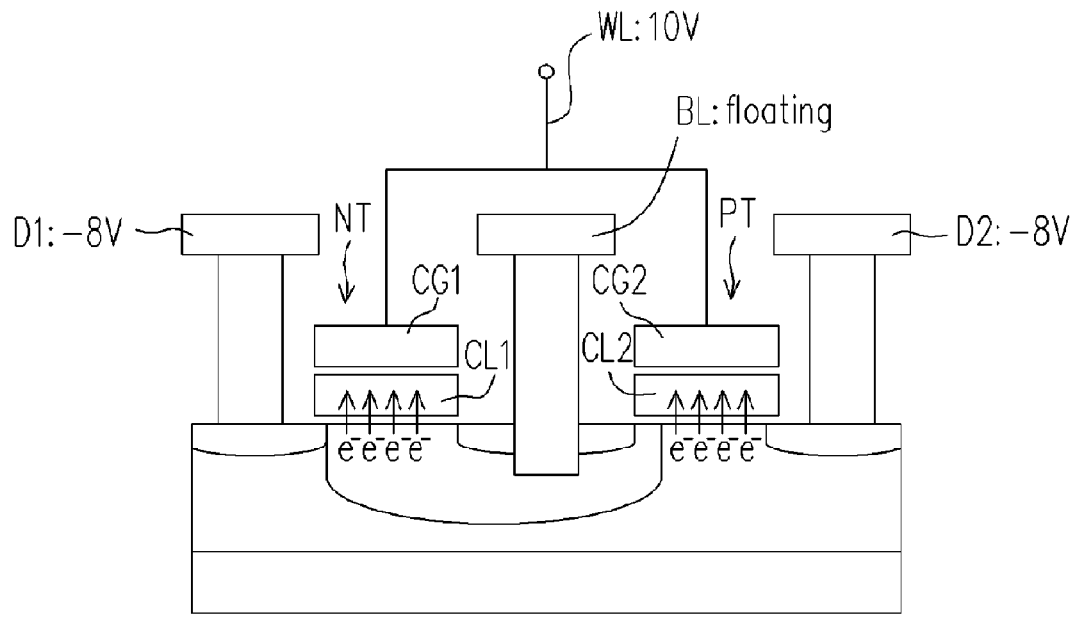
FIGS. 3A-3D are schematic drawings showing a method of operating a programmable and erasable digital switch device according to a preferred embodiment of the present invention.
Figure 4A:
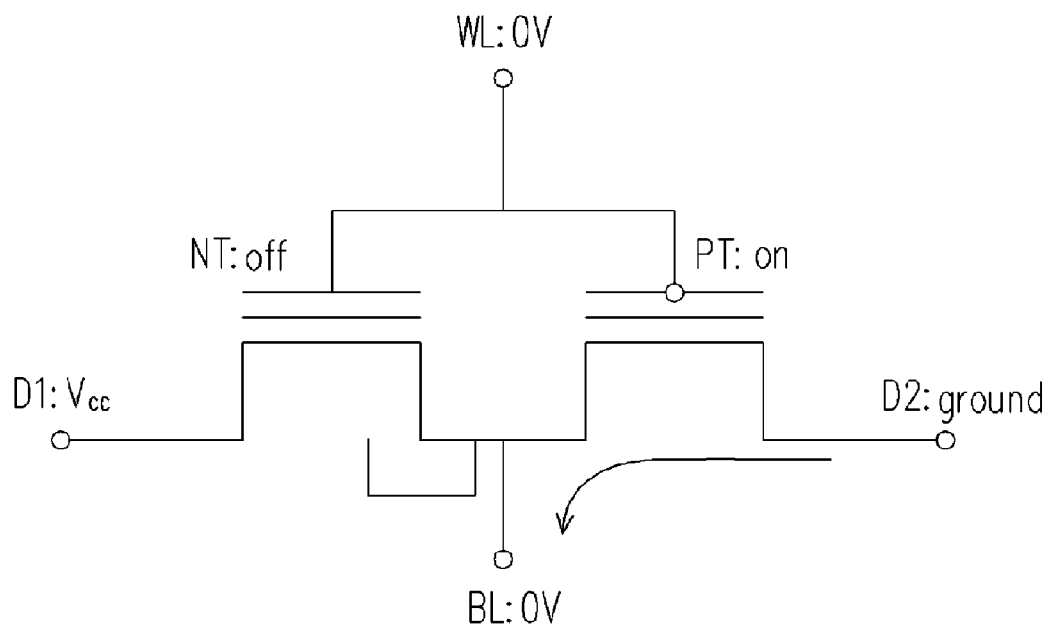
FIGS. 4A and 4B are schematic circuits showing a method of operating a programmable and erasable digital switch device according to a preferred embodiment of the present invention.
Figure 4B:
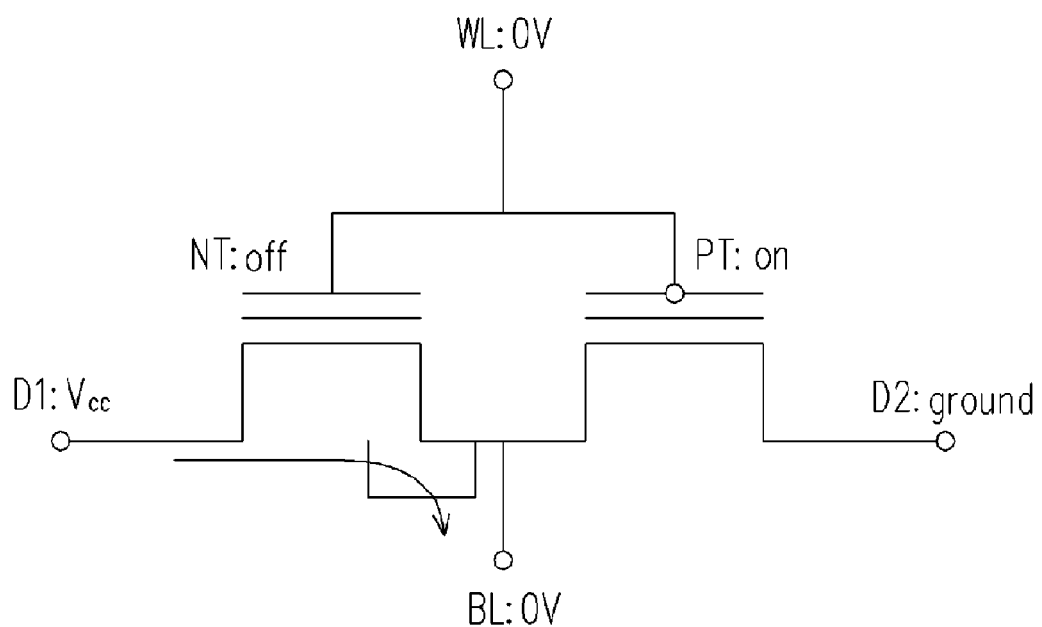

Referring to FIG. 3A, when erasing the programmable and erasable digital switch device of the present invention, the voltage Vge is applied to the word line WL, and the voltage Vge is about 10V. The voltage Vde is applied to the N-type doped region D1 of the N-type memory transistor NT and the P-type doped region D2 of the P-type memory transistor PT. The voltage Vde is about −8V. The bit line BL is floating so that to create a large at electrical field between the control gates CG1 and CG2 and the substrate. Then, electrons are injected into the charge storage layers CL1 and CL2 by FN tunneling effect to erase the N-type memory transistor NT and the P-type memory transistor PT. Thus, the N-type memory transistor NT and the P-type memory transistor PT have positive threshold voltages larger than Vcc.

Figure 3B:
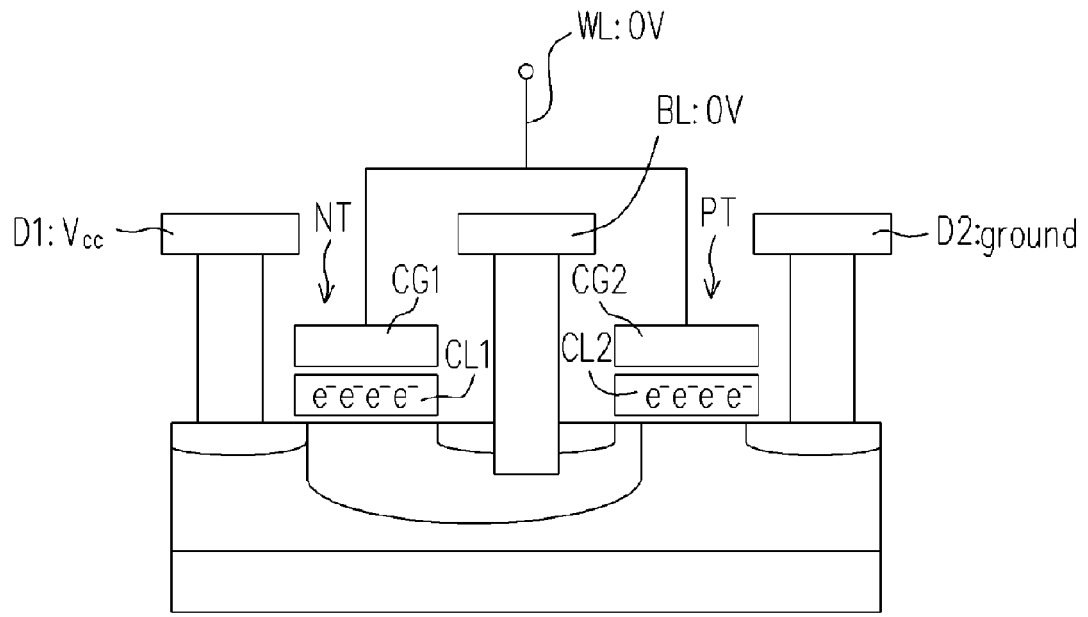

Referring to FIG. 3B, when the erased programmable and erasable digital switch device of the present invention is read, 0V is applied to the word line WL. The voltage Vcc is applied to the N-type doped region D1 of the N-type memory transistor NT. The P-type doped region D2 of the P-type memory transistor PT is grounded. Since electrons are stored in the charge storage layers CL1 and CL2 of the N-type memory transistor NT and the P-type memory transistor PT, respectively, the P-type memory transistor PT is "on", while the N-type memory transistor NT is "off". Accordingly, current flow cannot pass the N-type memory transistor NT. On the other hand, the 0V of the bit line BL (output terminal) is equal to that of the P-type doped region D2 because the P-type memory transistor PT is "on". Accordingly, the output voltage of the bit line BL (output terminal) is 0V as shown in FIG. 4A.

Figure 3C:
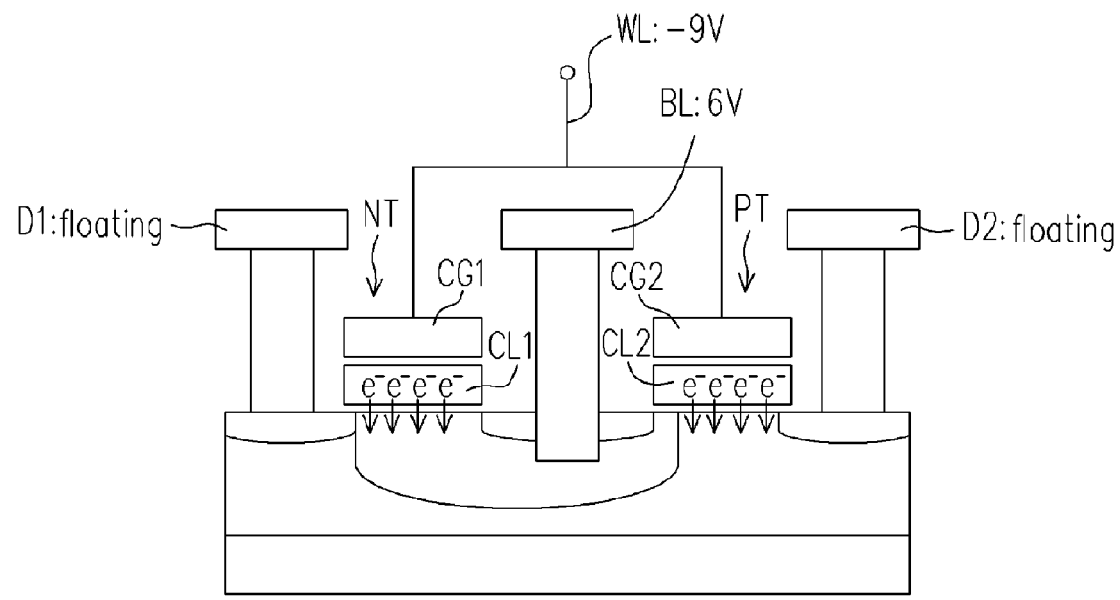

Referring to FIG. 3C, when programming the programmable and erasable digital switch device of the present invention, the voltage Vgp is applied to the word line WL, and the voltage Vgp is about −9V. The voltage Vbp is applied to the common bit line. The voltage Vbp is about 6V. N-type doped region D1 of the N-type memory transistor NT and the P-type doped region D2 of the P-type memory transistor PT are floating. A large electrical field is created between the control gates CG1 and CG2 and the substrate. Then, electrons are ejected from the charge storage layers CL1 and CL2 to the substrate by FN tunneling effect to program the N-type memory transistor NT and the P-type memory transistor PT. Thus, the N-type memory transistor NT and the P-type memory transistor PT have negative threshold voltages less than −Vcc.

Figure 3D:
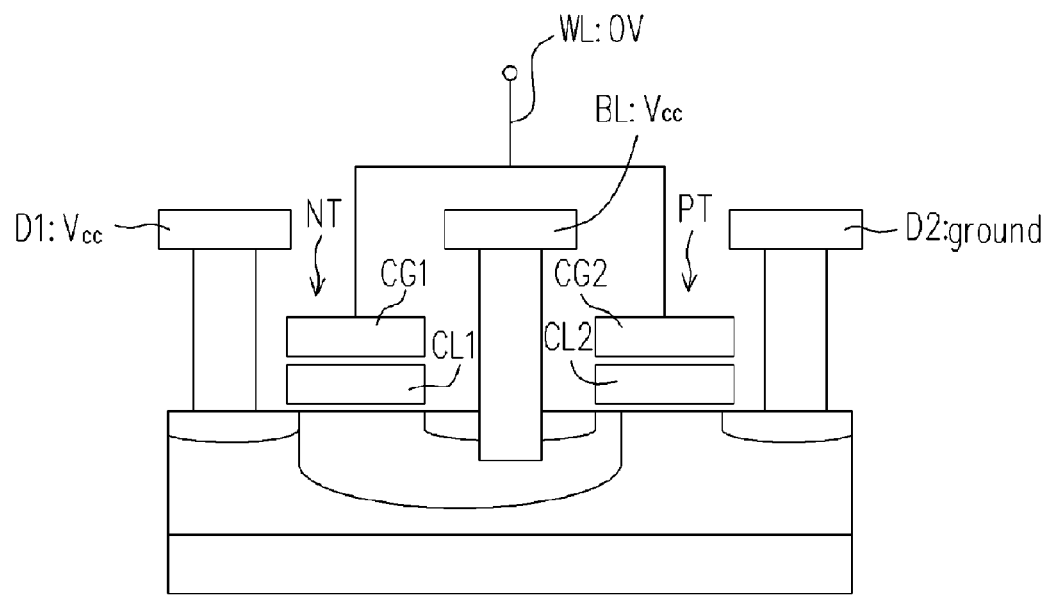

Referring to FIG. 3D, when the programmed programmable and erasable digital switch device of the present invention is read, 0V is applied to the word line WL. The voltage Vcc is applied to the N-type doped region D1 of the N-type memory transistor NT. The P-type doped region D2 of the P-type memory transistor PT is grounded. Since no electron is stored in the charge storage layers CL1 and CL2 of the N-type memory transistor NT and the P-type memory transistor PT, respectively, the P-type memory transistor PT is "off", while the N-type memory transistor NT is "on". Accordingly, current flow cannot pass the P-type memory transistor PT. The voltage of the bit line BL (output terminal) is equal to that of the N-type doped region D1 because the N-type memory transistor NT is on. Accordingly, the output voltage of the bit line BL (output terminal) is the voltage Vcc as shown in FIG. 4B.

Accordingly, when the programmable and erasable digital switch device of the present invention is in the erased state, the bit line BL (output terminal) has the output voltage 0V same as that of the P-type doped region D2. When the programmable and erasable digital switch device of the present invention is in the programmed state, the bit line BL (output terminal) has the output voltage Vcc same as that of the N-type doped region D1. By the programmed or erased state of the programmable and erasable digital switch device of the present invention, the bit line BL (output terminal) outputs the digital information "0" or "1".

If the material of the charge storage layers CL1 and CL2 of the N-type memory transistor NT and the P-type memory transistor PT is conductive material, such as doped polysilicon, the charge storage layers CL1 and CL2 are electrically coupled to each other. Accordingly, the erased or programmed state of the N-type memory transistor NT and the P-type memory transistor PT can be consistent. The stability and reliability of the programmable and erasable digital switch device of the present invention are thus enhanced.

Additionally, the erasing and programming of the programmable and erasable digital switch device of the present invention are performed with FN tunneling effect. It has high electron injection efficiency and low current consumption. The power consumption of the whole chip is efficiently reduced. Moreover, the present invention can repetitively erase and program of the programmable and erasable digital switch device. Accordingly, the output of the programmable and erasable digital switch device of the present invention can be modified when needed.

FIGS. 5A-5D are schematic cross sectional views showing progress of a method of fabricating a programmable and erasable digital switch device according to a preferred embodiment of the present invention. FIGS. 5A-5D are process cross sectional views of the structure of FIG. 1A along A-A'.

Figure 5A:
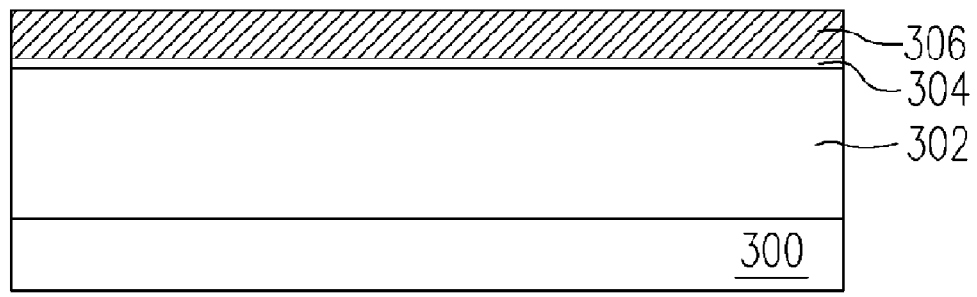
FIGS. 5A-5H are schematic cross sectional views showing progress of a method of fabricating a programmable and erasable digital switch device according to a preferred embodiment of the present invention.

Referring to FIG. 5A, a P-type substrate 300 is provided. The P-type substrate 300 can be, for example, a silicon substrate. Then, a deep n-type well region 302 is formed within the P-type substrate 300. A dielectric layer 304 is formed over the surface of the P-type substrate 300, serving as a tunnel oxide layer. The material of the dielectric layer 304 can be, for example, silicon oxide. The dielectric layer 304 can be formed by, for example, a thermal oxidation method.

A charge storage layer 306 is then formed over the dielectric layer 304. Its material can be, for example, a conductive material, such as doped polysilicon. The charge storage layer 306 may be formed by the following steps. For example, an undoped polysilicon layer is formed by a chemical vapor deposition (CVD) method. Then, an ion implantation process is performed to the undoped polysilicon layer. It may also be formed by an in-situ doping method and a CVD method. Of course, the material of the charge storage layer 306 can be, for example, a charge trapping material, such as silicon nitride. Then, the charge storage layer 306 can be patterned based on the practical requirement. For example, when the programmable and erasable digital switch device of FIG. 1A is going to be fabricated, the charge storage layer 306 needs to be patterned as a strip. In the subsequent process of forming the control gate, the charge storage layer 306 is divided into separate blocks. In some embodiments, when the programmable and erasable digital switch device as shown in FIG. 1C is going to be fabricated, the charge storage layer 306 need not be patterned.

Figure 5B:
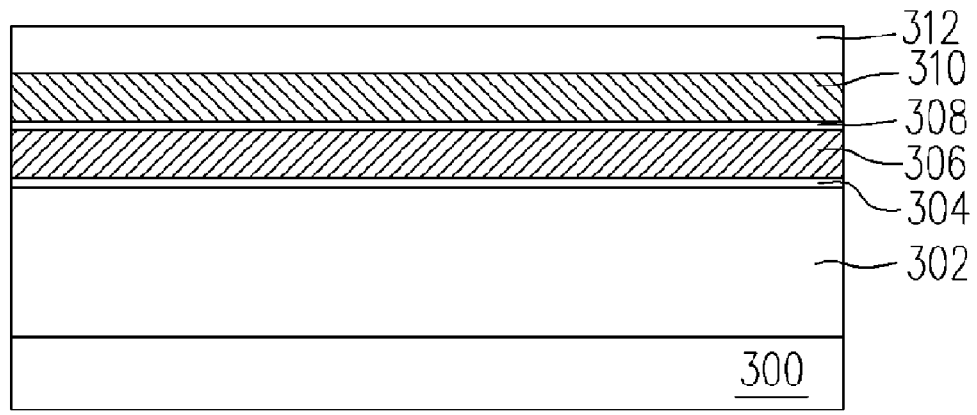

Referring to FIG. 5B, a dielectric layer 308, a conductive layer 310 and a cap layer 312 are sequentially formed over the P-type substrate 300.

The material of the dielectric layer 308 can be, for example, silicon oxide/silicon nitride/silicon oxide (ONO) with a thickness about 60 Å/70 Å/60 Å. The method of forming the dielectric layer 308 may include the following steps. For example, a silicon oxide layer is formed by a thermal oxidation method. A silicon nitride layer and another silicon oxide layer are then formed by a low pressure CVD (LPCVD) method. In some embodiments, the dielectric layer 308 can be a single silicon oxide layer or a silicon oxide/silicon nitride (ON) layer.

The material of the conductive layer 310 can be, for example, doped polysilicon. The conductive layer 310 may be formed by the following steps. For example, an undoped polysilicon layer is formed by a chemical vapor deposition (CVD) method. An ion implantation is then performed to the undoped polysilicon layer. It may also be formed by an in-situ doping method and a CVD method.

The material of the cap layer 312 can be, for example, silicon nitride or silicon oxide. The cap layer 312 can be formed by, for example, a CVD method.

Figure 5C:
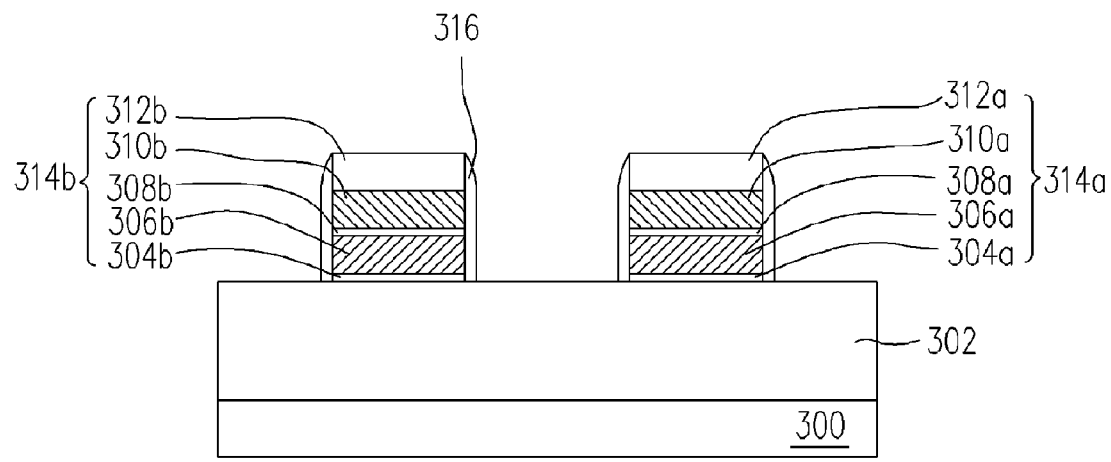

Referring to FIG. 5C, the cap layer 312 and the conductive layer 310 are patterned with a mask (not shown) to define the cap layer 312a and 312b and the conductive layer 310a and 310b serving as the control gates. While the conductive layer 312a is defined, the dielectric layer 308, the charge storage layer 306 and the tunnelling dielectric layer 108 are also defined to form the inter-gate dielectric layers 308a and 308b, the charge storage layers 306a and 306b and the tunnelling dielectric layers 304a and 304b, respectively. The mask is then removed. The charge storage layer 306 is patterned into separate blocks. The separate charge storage layers 306a and 306b serve as floating gates.

Referring to FIG. 5C, the stacked gate structures 314a and 314b are constituted by the gate cap layers 312a and 312b, the conductive layers 310a and 310b (control gates), the inter-gate dielectric layers 308a and 308b, the charge storage layers 306a and 306b (floating gates) and the tunnelling dielectric layers 304a and 304b, respectively. Moreover, the conductive layer 310a (control gate) is electrically coupled to the conductive layer 310b (control gate). The spacers 316 are formed on the sidewalls of the stacked gate structures 314a and 314b. The method of forming spacers includes the following steps. First, an insulation layer (not shown) is formed. The material of the insulation layer can be, for example, silicon nitride. Then, a portion of the insulation layer is removed by anisotropic etch method.

Figure 5D:
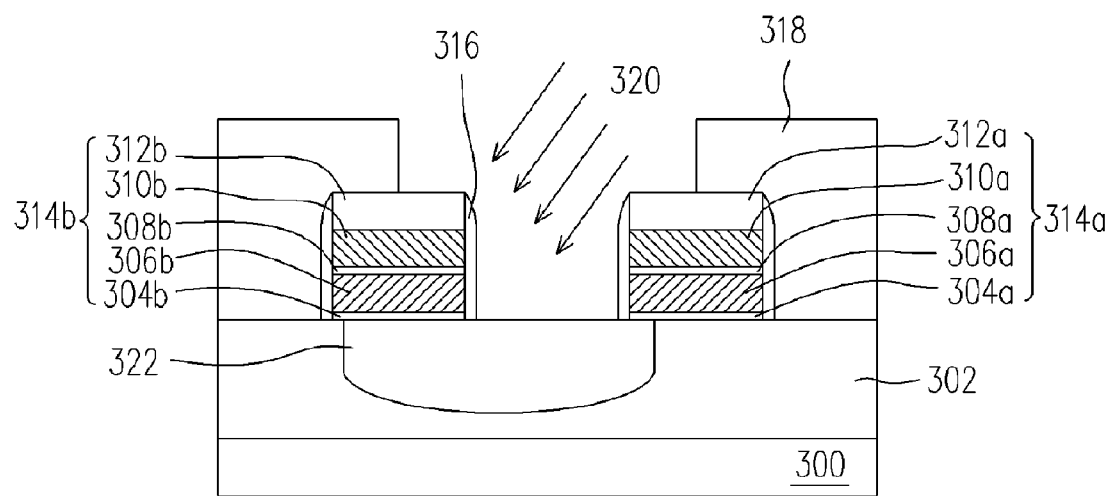

Referring to FIG. 5D, a patterned mask layer 318 is then formed over the P-type substrate 300. The patterned mask layer 318 exposes the substrate 300 between the stacked gate structures 314a and 314b. Then, a dopant implantation is performed in step 320. Dopants are implanted in the substrate 300 between the stacked gate structures 314a and 314b to form the P-type doped region 322 by using the stacked gate structures 314a and 314b and the patterned mask layer 318 as mask. Wherein, the dopant implantation method is an ion implantation method with a tilt angle. Accordingly, one end of the P-type doped region 322 extends under the stacked gate structure 314b.

Figure 5E:
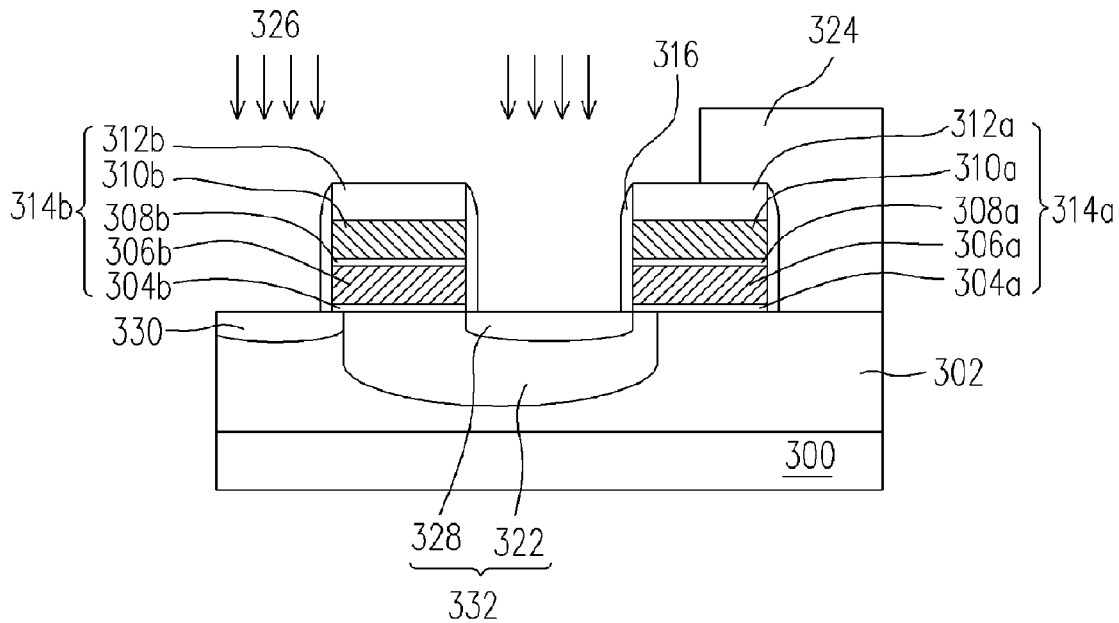

Referring to FIG. 5E, after the patterned mask layer 318 is removed, a thermal process is performed. The thermal process is performed under a temperature about 900° C. and an oxygen-contained environment to drive in dopants.

Then, another patterned mask layer 324 is formed over the substrate 300. The patterned mask layer 324 exposes the substrate 300 adjacent to two sides of the stacked gate structure 314b. Then, adopant implantation process is performed in step 326. Dopants are implanted in the substrate 300 adjacent to two sides of the stacked gate structure 314b to form the N-type doped regions 328 and 320 by using the stacked gate structure 314b and the patterned mask layer 324 as a mask. The N-type doped region 328 is in and surrounded by the P-type doped region 322. The N-type doped region 328 and the P-type doped region 322 constitute the common bit line doped region 332. The N-type doped region 330 is adjacent to the P-type doped region 322. It means that the P-type doped region 322 extends under the stacked gate structure 314b, and is adjacent to the N-type doped region 330. The dopant implantation method can be an ion implantation method.

Figure 5F:
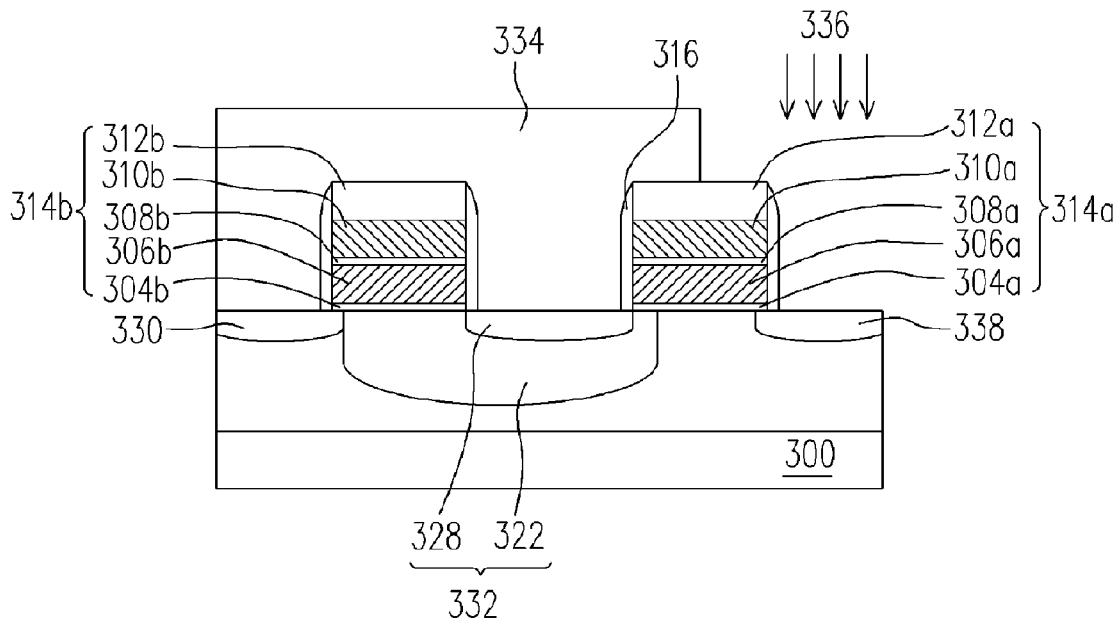

Referring to FIG. 5F, after the patterned mask layer 324 is removed, the patterned mask layer 334 is formed over the substrate 300. The patterned mask layer 334 exposes the substrate 300 beside the stacked gate structure 314a corresponding to the p-type doped region 322. Then, a dopant implantation process is performed in step 336. Dopants are implanted in the substrate 300 outside the stacked gate structure 314a to form the P-type doped regions 338 by using the stacked gate structure 314a and the patterned mask layer 334 as mask. The dopant implantation method can be an ion implantation method. Wherein, the stacked gate structure 314a, the N-type well region 302 and the P-type doped regions 322 and 338 constitute the P-type memory transistor. The stacked gate structure 314b, the P-type doped region 322 and the N-type doped regions 328 and 330 constitute the N-type memory transistor.

Figure 5G:
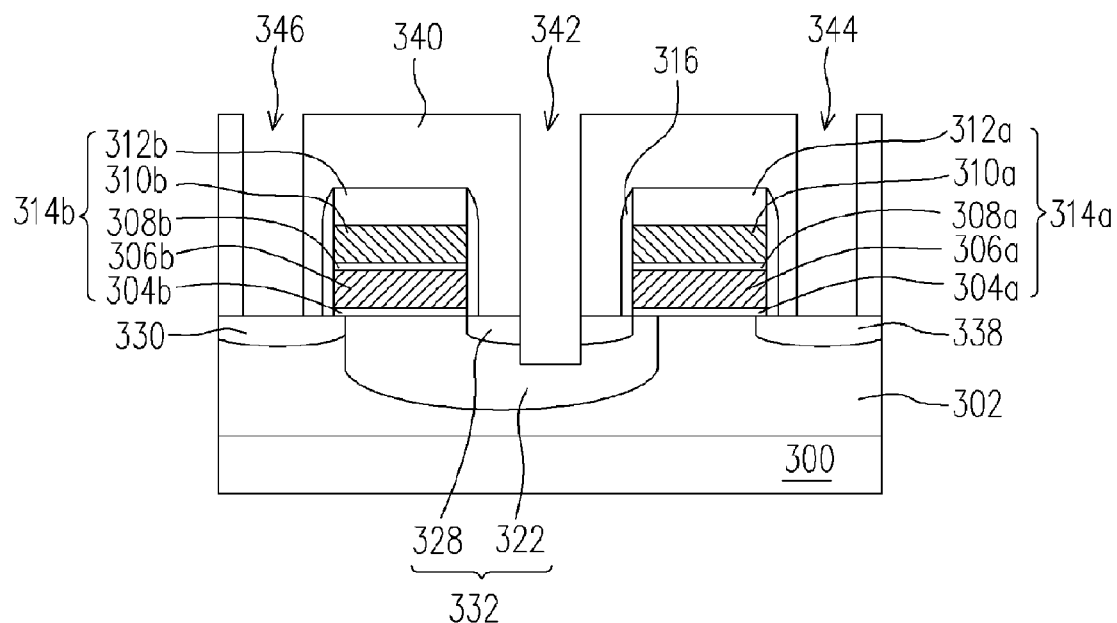

Referring to FIG. 5G, after the patterned mask layer 344 is removed, an inter dielectric layer 340 is formed over the substrate 300. The material of the inter dielectric layer 340 can be, for example, boron-phosphorous silicate glass (BPSG) or phosphorous silicate glass (PSG). The inter dielectric layer 340 can be formed by a CVD method, for example. A chemical-mechanical polish (CMP) method is then performed to planarize the inter dielectric layer 340.

Then, the inter dielectric layer 340 is patterned to form the opening 346 exposing the N-type doped region 330 and the opening 344 exposing the P-type doped region 338. The inter dielectric 340 is then patterned again to form the opening 342 exposing the common bit line doped region 332. The opening 342 exposes the P-type doped region 322. It means that the opening 342 is formed across the interface of the N-type doped region 328 and the P-type doped region 322. The method of patterning the inter dielectric layer 340 includes, for example, a photolithographic process and an etching process.

Figure 5H:
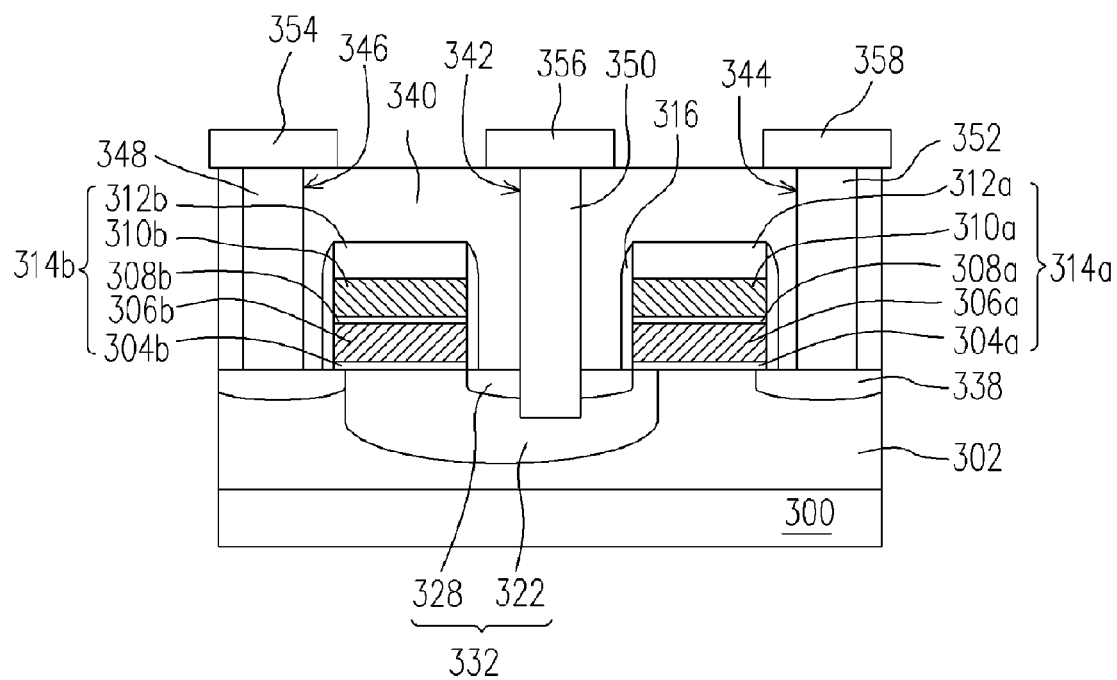

Referring to FIG. 5H, conductive plugs 348, 350 and 352 are formed in the openings 342, 344 and 346 in the inter dielectric layer 340, respectively. The material of the conductive plugs 348, 350 and 352 can be, for example, tungsten. The method of forming the conductive plugs 348, 350 and 352 may include the following steps. For example, a conductive material layer is formed over the inter dielectric layer 340. Then, the conductive material outside the conductive plugs 348, 350 and 352 is removed to form the conductive plugs 348, 350 and 352. The conductive lines 354, 356 and 358 are formed over the inter dielectric layer 340 and are electrically coupled to the conductive plugs 348, 350 and 352, respectively. The method of forming the conductive layers 354, 356 and 358 may include the following steps. For example, a conductive layer (not shown) is formed over the substrate 300. A photolithographic process and an etch process are then performed to the conductive layers 354, 356 and 358. The conductive plug 350 passes through the interface of the N-type doped region 328 and the P-type doped region 322 so that they are electrically short.

According to the present invention, the patterned mask layer 318 exposes the substrate 300 between the stacked gate structures 314a and 314b. An ion implantation process with a tilt angle is then performed to form the P-type doped region 322 extending under the gate stack structure 314b. A thermal process is performed to drive dopants in the substrate 300. Another patterned mask layer 334 exposes the substrate 300 adjacent to two sides of the stacked gate structure 314b to form the N-type doped regions 328 and 330 in the substrate 300 adjacent to two sides of the stacked gate structure 314b. The N-type doped region 328 and the P-type doped region 322 constitute the common bit line doped region 332. The P-type doped region 322 extends under the stacked gate structure 314b, and is adjacent to the N-type doped region 330. The P-type doped region 322 can be precisely formed at the desired location by the ion implantation process with a tilt angle. The N-type memory transistor and the P-type memory transistor share the common bit line doped region 332. The P-type doped region 322 serves not only as a source/drain region of the P-type memory transistor, but also a substrate well region of the N-type memory transistor. Accordingly, the manufacturing process is saved and the device integrity is enhanced.

According to the programmable and erasable digital switch device of the present invention, the N-type memory transistor and the P-type memory transistor are maintained in the erased or programmed state so that the bit line (output terminal) outputs the digital data, such as "0" or "1". Therefore, the programmable and erasable digital switch device of the present invention is adapted for programming and erasing for multiple times.

If the charge storage layer of the N-type memory transistor is electrically coupled to the charge storage layer of the P-type memory transistor, the erased and programmed states of the N-type memory transistor and the P-type memory transistor can be consistent. Accordingly, the stability and reliability of the programmable and erasable digital switch device of the present invention can be improved.

Additionally, the erasing and programming of the programmable and erasable digital switch device of the present invention are performed with FN tunneling effect. It has high electron injection efficiency and low current consumption. The power consumption of the whole chip is efficiently reduced.

Moreover, the programmable and erasable digital switch device of the present invention can be easily fabricated. The fabrication method is compatible with the process of fabricating a BiNOR gate flash memory so that it is applicable to memory cell.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A programmable and erasable digital switch device, comprising:
   a substrate;
   an N-type memory transistor disposed on the substrate, the N-type memory transistor comprising a first N-type doped region, a second N-type doped region, a first charge storage layer and a first control gate;
   a P-type memory transistor disposed next to the N-type memory transistor, the P-type memory transistor comprising a first P-type doped region, a second P-type doped region, a second charge storage layer and a second control gate, wherein the second control gate is electrically coupled to the first control gate; and
   a common bit line doped region electrically coupled to the N-type memory transistor and the P-type memory transistor.

2. The device of claim 1, further comprising a common bit line electrically coupled to the common bit line doped region.

3. The device of claim 1, further comprising a word line electrically connecting the first control gate and the second control gate.

4. The device of claim 1, wherein the first charge storage layer is electrically coupled to the second charge storage layer.

5. The device of claim 4, wherein materials of the first charge storage layer and the second charge storage layer comprise doped polysilicon.

6. The device of claim 1, wherein materials of the first charge storage layer and the second charge storage layer comprise silicon nitride or doped polysilicon.

7. The device of claim 1, wherein the common bit line doped region is constituted of the first N-type doped region surrounding by the second P-type doped region.

8. The device of claim 7, wherein the second P-type doped region further disposed under the first charge storage layer and adjacent to the second N-type doped region.

9. The device of claim 7, further comprising a common bit line electrically coupled to the common bit line doped region, and electrically short to the second P-type doped region and the first N-type doped region.

10. The device of claim 1, wherein the N-type memory transistor further comprises:
    a first inter-gate dielectric layer disposed between the first charge storage layer and the first control gate; and
    a first tunnelling dielectric layer disposed between the first charge storage layer and the substrate; and
    the P-type memory transistor further comprises:
    a second inter-gate dielectric layer disposed between the second charge storage layer and the second control gate; and
    a second tunnelling dielectric layer disposed between the second charge storage layer and the substrate.

11. A programmable and erasable digital switch device, comprising:
    a substrate;
    a first conductive type well disposed within the substrate;
    a first stacked gate structure and a second stacked gate structure disposed on the substrate, the first stacked gate structure comprising a first charge storage layer and a first control gate, the second stacked gate structure comprising a second charge storage layer and a second control gate, the first control gate being electrically coupled to the second control gate;
    a first conductive type first doped region and a first conductive type second doped region disposed in the substrate adjacent to two sides of the first stacked gate structure respectively; and
    a second conductive type first doped region and a second conductive type second doped region disposed within the substrate adjacent to one of two sides of the second stacked gate structure respectively, wherein the second conductive type first doped region surrounds the first conductive type second doped region, and extends under the first stacked gate structure.

12. The device of claim 11, wherein the first charge storage layer and the second charge storage layer are formed as an integral layer.

13. The device of claim 11, wherein materials of the first charge storage layer and the second charge storage layer comprise silicon nitride or doped polysilicon.

14. The device of claim 11, further comprising a conductive plug electrically short and connecting the second conductive type first doped region to the first conductive type second doped region.

15. The device of claim 11, wherein the first stacked gate structure further comprises:
    a first inter-gate dielectric layer, disposed between the first charge storage layer and the first control gate; and
    a first tunnelling dielectric layer, disposed between the first charge storage layer and the substrate;
    the second stacked gate structure further comprises:
    a second inter-gate dielectric layer, disposed between the second charge storage layer and the second control gate; and
    a second tunnelling dielectric layer, disposed between the second charge storage layer and the substrate.

16. The device of claim 11, wherein the first conductive type is N-type, and the second conductive type is P-type.

17. The device of claim 11, wherein the second conductive type third doped region is further adjacent to the first conductive type second doped region.

18. A method of fabricating a programmable and erasable digital switch device, comprising:
    providing a substrate;
    forming a first stacked gate structure and a second stacked gate structure on the substrate, the first stacked gate structure comprising a first tunnelling dielectric layer, a first charge storage layer, a first inter-gate dielectric layer and a first control gate, the second stacked gate structure comprising a second tunnelling dielectric layer, a second charge storage layer, a second inter-gate dielectric layer and a second control gate, the first control gate being electrically coupled to the second control gate;
    forming a first conductive type first doped region within the substrate between the first stacked gate structure and the second stacked gate structure, the first conductive type first doped region extending under the first stacked gate structure;
    forming a second conductive type first doped region and a second conductive type second doped region within the substrate adjacent to two sides of the first stacked gate structure, wherein the first conductive type first doped region surrounds the second conductive type second doped region; and
    forming a first conductive type second doped region within the substrate outside the second stacked gate structure.

19. The method of claim 18, further comprising forming a conductive plug over the substrate, the conductive plug electrically connects the second conductive type third doped region and the first conductive type first doped region.

20. The method of claim 18, wherein the first charge storage layer and the second charge storage layer are formed as an integral layer.

21. The method of claim 18, wherein step of forming the first conductive type first doped region within the substrate between the first stacked gate structure and the second stacked gate structure comprises:
forming a first patterned mask layer over the substrate, the first patterned mask layer exposing the substrate between the first stacked gate structure and the second stacked gate structure;
performing an ion implantation process with a tilt angle to form the first conductive type first doped region so that the first conductive type first doped region extends under the first stacked gate structure; and
removing the first patterned mask layer.

22. The method of claim 18, wherein step of forming the second conductive type first doped region and the second conductive type second doped region comprises:
forming a second patterned mask layer over the substrate, the second patterned mask layer exposing the substrate on the two sides of the first stacked gate structure;
performing an ion implantation process to form the second conductive type first doped region and the second conductive type second doped region; and
removing the second patterned mask layer.

23. The method of claim 18, wherein step of forming the first conductive type second doped region comprises:
forming a third patterned mask layer over the substrate, the third patterned mask layer exposing the substrate beside the second stacked gate structure corresponding to the first conductive type first region;
performing an ion implantation process to form the first conductive type fourth doped region; and
removing the third patterned mask layer.

24. The method of claim 18, wherein step of forming the first stacked gate structure and the second stacked gate structure on the substrate comprises:
forming a first dielectric layer over the substrate;
forming a strip conductive layer over the first dielectric layer;
forming a second dielectric layer over the substrate;
forming a conductive layer over the second dielectric layer; and
patterning the conductive layer, the second dielectric layer, the strip conductive layer and the first dielectric layer to form the first stacked gate structure and the second stacked gate structure, wherein the strip conductive layer is patterned to form the first charge storage layer and the second charge storage layer separately.

25. The method of claim 24, wherein materials of the first charge storage layer and the second charge storage layer comprise doped polysilicon.

26. The method of claim 18, wherein steps of forming the first stacked gate structure and the second stacked gate structure on the substrate comprise:
forming a first dielectric layer over the substrate;
forming a charge storage material layer over the first dielectric layer;
forming a second dielectric layer over the substrate;
forming a conductive layer over the second dielectric layer; and
patterning the conductive layer, the second dielectric layer, the charge storage material layer and the first dielectric layer to form the first stacked gate structure and the second stacked gate structure, wherein the charge storage material layer is patterned to form the first charge storage layer and the second charge storage layer, and the first charge storage layer and the second charge storage layer are formed as an integral layer.

27. The method of claim 26, wherein materials of the first charge storage layer and the second charge storage layer comprise doped polysilicon or silicon nitride.

28. A method of operating a programmable and erasable digital switch device, the programmable and erasable digital switch device comprising: an first conductive type memory transistor at least comprising a first conductive type first doped region, a first conductive type second doped region, a first charge storage layer and a first control gate; a second conductive type memory transistor at least comprising a second conductive type first doped region, a second conductive type second doped region, a second charge storage layer and a second control gate; a common bit line electrically coupled to a common bit line doped region constituted by the first conductive first type doped region and the second conductive type second doped region; and a word line electrically connecting the first control gate and the second control gate; the method comprising:
performing an erasure operation by injecting electrons into the first charge storage layer and the second charge storage layer so that the first conductive type memory transistor and the second conductive type memory transistor have positive threshold voltages.

29. The method of claim 28, wherein the step of performing an erasure operation comprises:
applying a first voltage to the word line, applying a second voltage to the second conductive type first doped region and the first conductive type second doped region, and floating the common bit line so that electrons are injected into the first charge storage layer and the second charge storage layer by F-N tunneling effect to erase the first conductive type memory transistor and the second conductive type memory transistor.

30. The method of claim 29, wherein the first voltage is about 10V, and the second voltage is about −8V.

31. The method of claim 28, further comprising:
performing a reading operation by applying a third voltage to the word line, applying 0V to the second conductive type first doped region, and applying a fourth voltage to the first conductive type second doped region so that the first conductive type memory transistor maintains off, and the second conductive type memory transistor outputs 0V through the common bit line.

32. The method of claim 31, wherein the third voltage is about 0V, and the fourth voltage is about Vcc.

33. The method of claim 28, further comprising:
performing a programming operation by ejecting electrons from the first charge storage layer and the second charge storage layer so that the first conductive type memory transistor and the second conductive type memory transistor have negative threshold voltages.

34. The method of claim 33, wherein the step of performing a programming operation comprises:
applying a fifth voltage to the word line, floating the second conductive type first doped region and the first conductive type second doped region, and applying a sixth voltage to the common bit line so that electrons are ejected from the first charge storage layer and the second charge storage layer by F-N tunneling effect to program the first conductive type memory transistor and the second conductive type memory transistor.

35. The method of claim 34, wherein the fifth voltage is about −9V, and the sixth voltage is about 6V.

36. The method of claim 33, further comprising:
performing a reading operation by applying a seventh voltage to the word line, applying 0V to the second conductive type first doped region, and applying an eighth voltage to the first conductive type second doped region so that the second conductive type memory transistor maintains off, and the first conductive type memory transistor outputs a fourth voltage through the common bit line.

37. The method of claim 36, wherein the seventh voltage is about 0V, and the eighth voltage is about Vcc.

* * * * *